United States Patent
Prinz et al.

[11] Patent Number: 6,133,093
[45] Date of Patent: Oct. 17, 2000

[54] METHOD FOR FORMING AN INTEGRATED CIRCUIT

[75] Inventors: Erwin J. Prinz, Austin; Gregory M. Yeric, Dallas; Kevin Yun-kang Wu, Austin; Wei-Ming Chen, Austin; Frank Kelsey Baker, Austin, all of Tex.

[73] Assignee: Motorola, Inc., Schaumburg, Ill.

[21] Appl. No.: 09/015,957

[22] Filed: Jan. 30, 1998

[51] Int. Cl.⁷ ............................................. H01L 21/336
[52] U.S. Cl. ........................................................ 438/257
[58] Field of Search .................................. 438/787, 151, 438/902, 953, 359, 257; 257/664, 23, 139, 254, 292

[56] References Cited

U.S. PATENT DOCUMENTS

| | | | |
|---|---|---|---|
| 4,420,871 | 12/1983 | Scheibe | 29/571 |
| 5,116,775 | 5/1992 | Katto et al. | 437/52 |
| 5,278,087 | 1/1994 | Jenq | 437/43 |
| 5,587,332 | 12/1996 | Chang et al. | 437/43 |
| 5,830,795 | 11/1998 | Metha et al. | 438/275 |
| 5,861,347 | 1/1999 | Maiti et al. | 438/787 |

*Primary Examiner*—John F. Niebling
*Assistant Examiner*—Walter L. Lindsay, Jr.
*Attorney, Agent, or Firm*—Kent J. Cooper; James L. Clingan, Jr.

[57] ABSTRACT

In one embodiment, the reliability of an integrated circuit having a floating gate device (50), a high breakdown voltage transistor (52), and a low breakdown voltage transistor (54), which are electrically isolated from each other by a trench isolation region (12), is improved by using an oxidation resistant layer (24). The oxidation resistant layer (24) protects portions of the trench isolation region (12) when the gate dielectric layer (30) for the high breakdown voltage transistor (52) is formed, and when the gate dielectric layer (36) for the low breakdown voltage transistor (54) is formed. The oxidation resistant layer (24) minimizes etching of the field isolation region (12) so that thinning or recessing of the field isolation region (12) is minimized.

13 Claims, 4 Drawing Sheets

METHOD FOR FORMING AN INTEGRATED CIRCUIT

FIELD OF THE INVENTION

This invention relates generally to an integrated circuit, and more specifically to a method for forming an integrated circuit having multiple gate dielectric layers.

BACKGROUND OF THE INVENTION

The semiconductor industry continually strives to increase device performance and device density by reducing device dimensions. In addition, it is also desirable to increase the functionality of integrated circuits by incorporating multiple devices within the same integrated circuit. For a given chip size, device density can be increased by reducing the lateral distance separating active devices, or the device isolation width. Thus, advanced integrated circuits require a variety of devices to be integrated into the same integrated circuit without compromising the electrical isolation between adjacent active devices.

These advanced integrated circuits often include a variety of devices, each having a specific performance criteria. For example, an integrated circuit which includes both digital logic and non-volatile memory will require transistors having a high breakdown voltage to program the non-volatile memory and fast transistors having a lower breakdown voltage for digital logic. Likewise, a microprocessor integrated circuit having a low voltage core that interfaces with higher voltage peripherals will require transistors having a high breakdown voltage for the input/output (I/O) interface and transistors having a lower breakdown voltage for the core. Therefore, within an integrated circuit there may be multiple devices with differing breakdown voltage requirements. Thus, it is highly desirable to form high breakdown voltage transistors and low breakdown voltage transistors in the same integrated circuit without compromising the electrical isolation of either device.

The gate oxide layer of a transistor with a low breakdown voltage is typically thinner than the gate oxide layer of a transistor with a high breakdown voltage. Therefore, the formation of integrated circuits with both high breakdown voltage transistors and low breakdown voltage transistors requires two different gate dielectric layers to be formed. In addition, an integrated circuit having memory devices may require a third gate dielectric layer to be formed. The processes used to form these multiple gate dielectric layers, however, recess or thin the isolation region that lies between adjacent active devices, and thus electrical isolation between adjacent active devices is adversely effected by these processes. In addition, recessing of trench isolation regions during gate dielectric formation processes results in the formation of parasitic transistors along the trench sidewall which increase device leakage currents and result in the formation of inferior gate dielectric layers.

Accordingly, a need exists for a method of forming integrated circuits with multiple gate dielectric layers without degrading device isolation.

DETAILED DESCRIPTION OF A PREFERRED EMBODIMENT

Figure 1:
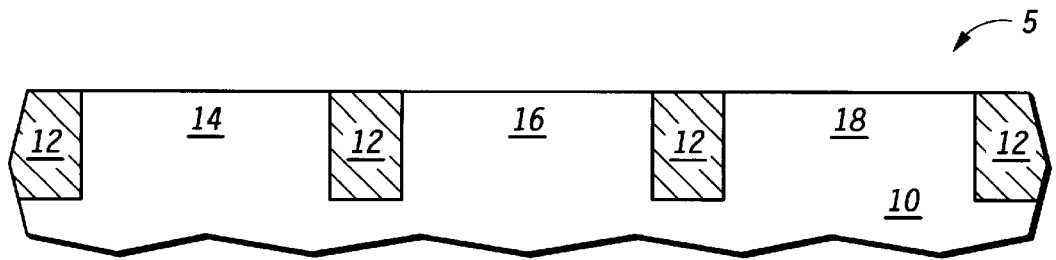
FIGS. 1–8 illustrate, in cross-section, process steps in accordance with one embodiment of the invention.

FIGS. 1–8 illustrate, in cross-section, a method for forming an integrated circuit in accordance with one embodiment of the present invention. Shown in FIG. 1 is a portion 5 of a semiconductor substrate 10 having a field isolation region 12 and active regions 14, 16, and 18 formed therein. In one embodiment, semiconductor substrate 10 is a monocrystalline silicon substrate. Alternatively, semiconductor substrate 10 may also be a silicon-on-insulator substrate, a silicon-on-sapphire substrate, or the like. In one embodiment, field isolation region 12 is a trench isolation region which has been formed using conventional etching and chemical-mechanical polishing techniques. Alternatively, field isolation region 12 may be a field oxide region formed using conventional field oxide formation techniques, such as local oxidation of silicon (LOCOS), poly-buffered LOCOS (PBL), polysilicon encapsulated local oxidation (PELOX), or the like.

Figure 2:
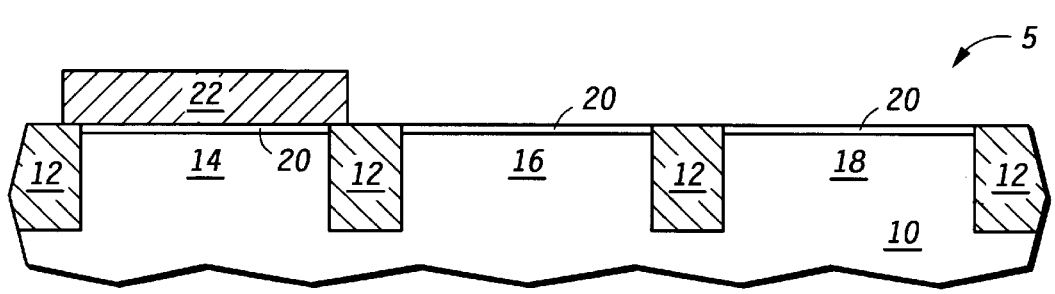

In FIG. 2, a gate dielectric layer 20 is formed overlying active region 14, active region 16, and active region 18. In one embodiment, gate dielectric layer 20 is formed by thermally oxidizing a portion of semiconductor substrate 10 to form a thermal oxide layer that overlies active region 14, active region 16, and active region 18. This thermal oxide layer is then annealed in an ambient comprising nitrous oxide ($NO_2$) to form a nitrided oxide layer having a thickness ranging from approximately 2 nanometers to approximately 10 nanometers. It should be appreciated that the thermal oxide layer could also be annealed in other nitriding ambients, such as ammonia ($NH_3$) or nitric oxide (NO), to form a nitrided oxide layer. Alternatively, gate dielectric layer may be a layer of thermal silicon dioxide, a layer of silicon nitride, a layer of silicon oxynitride, a layer of chemically vapor deposited silicon dioxide, or a combination thereof. After gate dielectric layer 20 has been formed, a conductive polysilicon layer is then deposited so that it overlies active regions 14, 16, and 18. The polysilicon layer is then patterned to leave a remaining portion 22 of the polysilicon layer overlying active region 14, as shown in FIG. 2. It should also be appreciated that remaining portion 22 may also be formed with another conductive layer, such as an amorphous silicon layer, a silicon-germanium layer, or the like.

Figure 3:
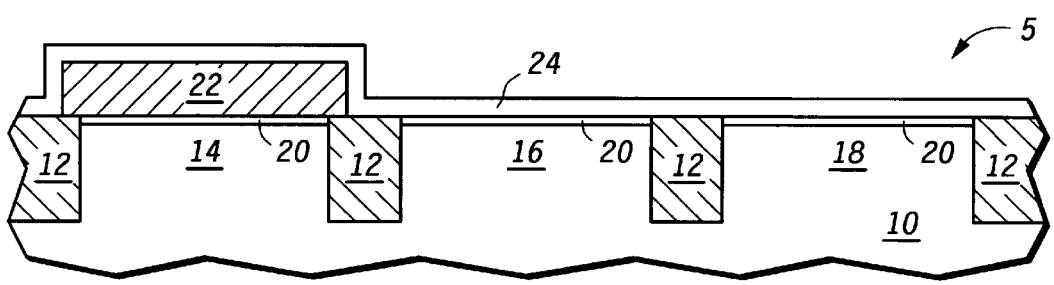

In FIG. 3, an oxidation resistant layer 24 is then formed overlying remaining portion 22, active region 16, and active region 18. In one embodiment, oxidation resistant layer 24 is an ONO dielectric layer. In this particular embodiment, a first oxide layer is formed by thermally oxidizing a portion of remaining portion 22 and then a layer of silicon nitride is chemically vapor deposited to overlie this first oxide layer, active region 16, and active region 18. A surface portion of the silicon nitride layer is then re-oxidized to form a second oxide layer overlying the silicon nitride layer. Alternatively, the second oxide layer may be formed using a layer of chemical vapor deposited silicon oxide. It should be appreciated that oxidation resistant layer 24 need not be formed as a composite layer. For example, oxidation resistant layer 24 may be formed using a layer of silicon nitride or a layer of silicon oxynitride.

Figure 4:
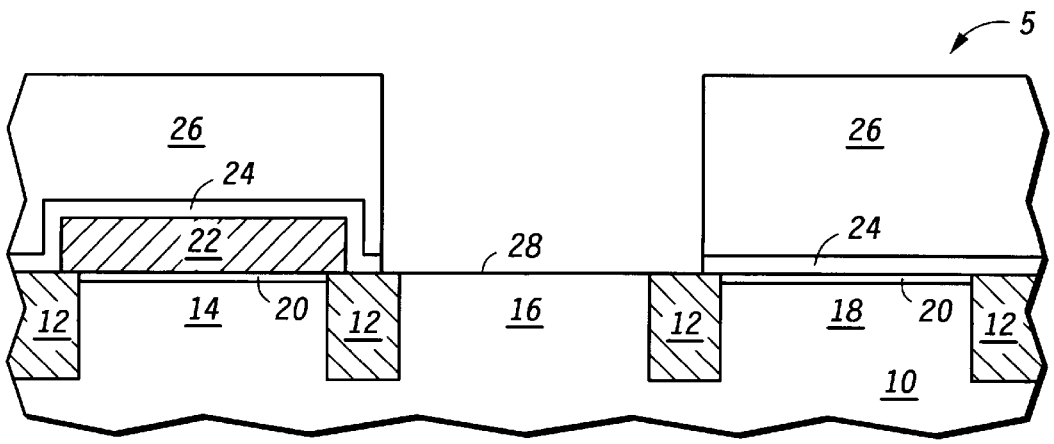

In FIG. 4, an etch mask 26 is formed overlying semiconductor substrate 10, and then a portion of oxidation resistant layer 24 and a portion of gate dielectric layer 20 that overlie active region 16 are removed to expose a surface portion 28 of semiconductor substrate 10. Oxidation resistant layer 24 and gate dielectric layer 20 may be removed using conventional dry or wet etching techniques or a combination thereof. For example, oxidation resistant layer 24 may be removed using a fluorinated plasma etch chemistry and gate dielectric layer 20 may be removed using hydrofluoric acid.

Figure 5:
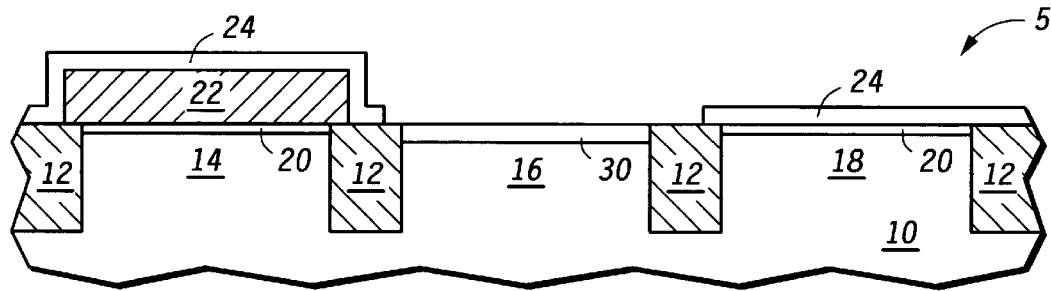

In FIG. 5, a gate dielectric layer 30 is then formed overlying active region 16. In one embodiment, gate dielectric layer 30 is a layer of thermal silicon dioxide having a thickness ranging from approximately 5 nanometers to approximately 50 nanometers, and is formed by thermally oxidizing surface portion 28 of semiconductor substrate 10. Alternatively, gate dielectric layer 30 may be a nitrided oxide layer, a silicon nitride layer, a silicon oxynitride layer, a layer of chemically vapor deposited silicon dioxide, or the like. It is important to note that oxidation resistant layer 24 protects active region 14 and active region 18 when gate dielectric layer 30 is formed. Specifically, oxidation resistant layer 24 prevents active region 18, remaining portion 22, and active region 14 from being oxidized or nitrided when gate dielectric layer 30 is formed. More importantly, oxidation resistant layer 24 also prevents portions of the field isolation region 12 from being etched when surface portion 28 is exposed, as shown in FIG. 4. In addition, oxidation resistant layer 24 also prevents portions of the field isolation region 12 from being etched when surface portion 28 is subsequently cleaned with a pre-gate clean that comprises hydrofluoric acid or with other ambients that would etch field isolation region 12.

Figure 6:
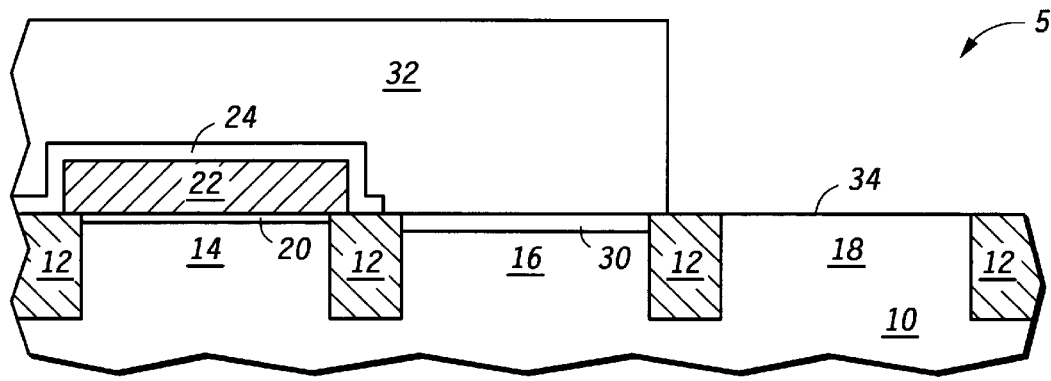

In FIG. 6, an etch mask 32 is formed overlying active region 14 and active region 16. A portion of oxidation resistant layer 24 and a portion of gate dielectric layer 20 that overlie active region 18 are then removed to expose a surface portion 34 of semiconductor substrate 10. As previously discussed, oxidation resistant layer 24 and underlying gate dielectric layer 20 may be removed using conventional dry or wet etching techniques or a combination thereof.

Figure 7:
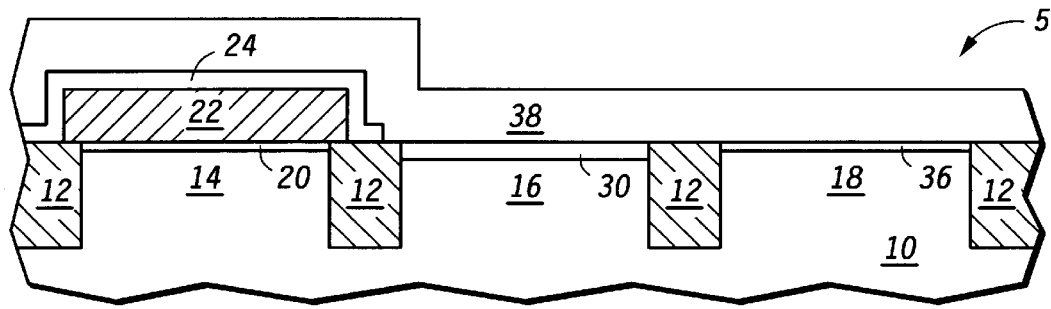

In FIG. 7, a gate dielectric layer 36 is then formed overlying active region 18. In one embodiment, gate dielectric layer 36 is a layer of thermal silicon dioxide having a thickness ranging from approximately 2 nanometers to approximately 15 nanometers, and is formed by oxidizing exposed portion 34 of semiconductor substrate 10. Alternatively, gate dielectric layer 36 may be a nitrided oxide layer, a silicon oxynitride layer, a silicon nitride layer, a layer of chemically vapor deposited silicon dioxide, or the like. Oxidation resistant layer 24 protects remaining portion 22 and active region 14 while gate dielectric layer 36 is formed. More importantly, oxidation resistant layer 24 also prevents portions of the field isolation region 12 from being etched when surface portion 34 is exposed. In addition, oxidation resistant layer 24 also prevents portions of the field isolation region 12 from being etched when surface portion 34 is subsequently cleaned with a pre-gate clean that comprises hydrofluoric acid or with other ambients that would etch field isolation region 12. It should be appreciated that gate dielectric layer 30 is exposed while gate dielectric layer 36 is formed. Therefore, the thickness and/or composition of gate dielectric layer 30 may change when gate dielectric layer 36 is formed. A polysilicon layer 38 is then formed overlying active region 14, active region 16, and active region 18, as shown in FIG. 7.

Figure 8:
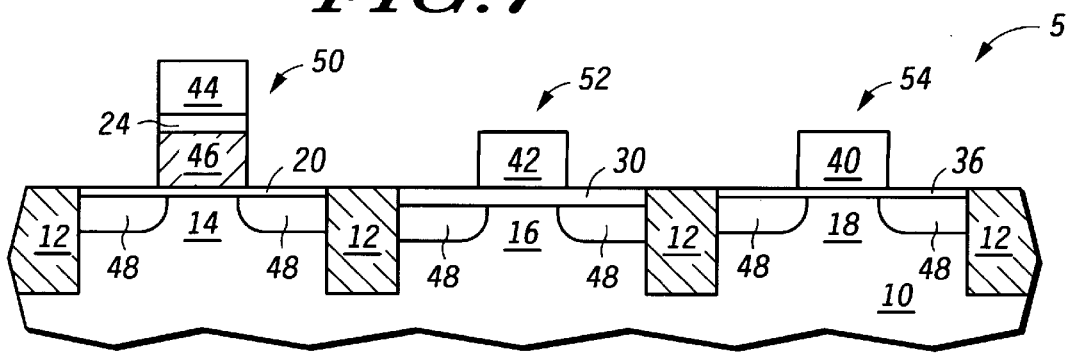

In FIG. 8, the polysilicon layer 38 is patterned to form a gate electrode 40 overlying active region 18, a gate electrode 42 overlying active region 16, and a control electrode 44 overlying active region 14. In one embodiment, remaining portion 22 is also patterned to form a floating gate 46, which is self-aligned to control gate electrode 44, as shown in FIG. 8. It should be appreciated that control gate electrode 44, gate electrode 40, and gate electrode 42 may be formed with a single etch step or in separate etch steps. In addition, control gate electrode 44, gate electrode 40, and gate electrode 42 may also be formed using an amorphous silicon layer, or other conductive layer, such as a metal layer, a metal silicide layer, a metal nitride layer, or a combination thereof.

Source/drain regions 48 are then formed within active region 14, active region 16, and active region 18. As a result, a floating gate device 50 is formed within active region 14, a transistor 52 is formed within active region 16, and a transistor 54 is formed within active region 18. It is important to note that floating gate device 50, transistor 52, and transistor 54 each have a different gate dielectric layer. This difference allows the performance of floating gate device 50, transistor 52 and transistor 54 to be individually optimized. In this particular embodiment, second gate dielectric layer 30 has a higher breakdown voltage than third gate dielectric layer 36 because second gate dielectric layer 30 is thicker than third gate dielectric layer 36. Therefore, transistor 52 can be characterized as high breakdown voltage transistor and transistor 54 can be characterized as a low breakdown voltage transistor. Thus, with the present invention an integrated circuit having devices with multiple gate dielectric layers can be fabricated, and etching of the field isolation region (12) which causes recessing or thinning of the field isolation region (12) can be minimized.

Figure 9:
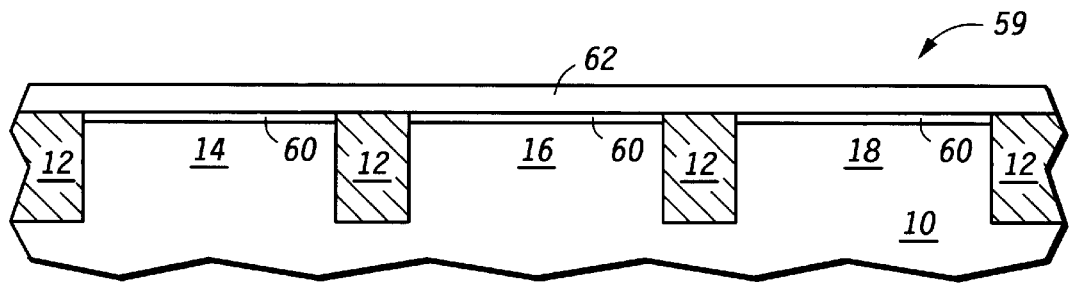
FIGS. 9–16 illustrate, in cross-section, process steps in accordance with an alternative embodiment of the invention.

FIGS. 9–16 illustrate, in cross section, a method for forming an integrated circuit in accordance with an alternative embodiment of the present invention. Shown in FIG. 9 is a portion 59 of a semiconductor substrate 10 wherein a pad oxide layer 60 and an oxidation resistant layer 62 have been formed overlying the semiconductor substrate of FIG. 1. In one embodiment, pad oxide layer 60 is formed by thermally oxidizing a portion of semiconductor substrate 10 to form a thermal oxide layer that overlies active region 14, active region 16, and active region 18. Alternatively, pad oxide layer 60 may be a layer of chemically vapor deposited silicon dioxide. In one embodiment, oxidation resistant layer 62 is formed by depositing a layer of silicon nitride over pad oxide layer 60. Alternatively, oxidation resistant layer 62 may be a layer of silicon oxynitride.

Figure 10:
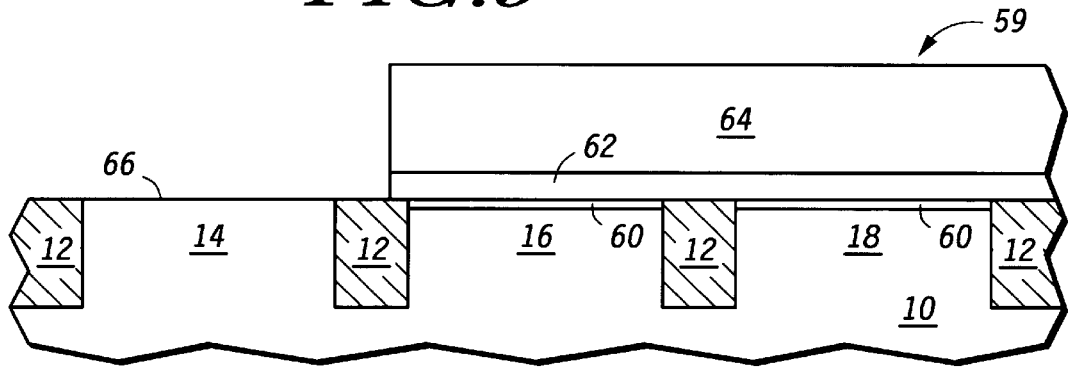

In FIG. 10, an etch mask 64 is formed overlying active region 16 and active region 18. A portion of oxidation resistant layer 62 and a portion of pad oxide layer 60 that overlie active region 14 are then removed to expose a surface portion 66 of semiconductor substrate 10. Oxidation resistant layer 62 and underlying pad oxide layer 60 may be removed using conventional dry or wet etching techniques or a combination thereof.

Figure 11:
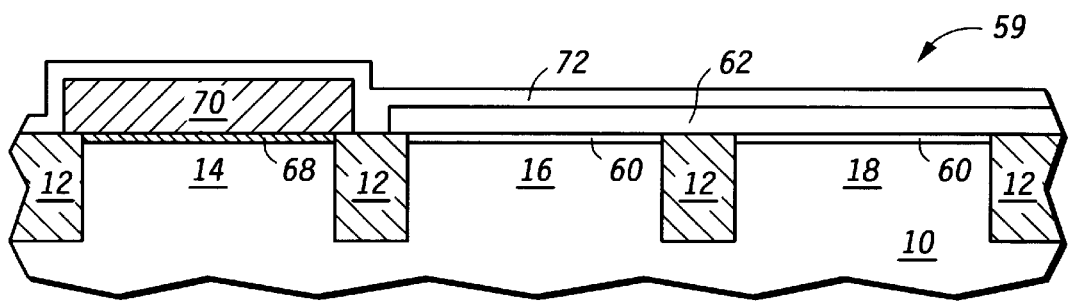

In FIG. 11, a gate dielectric layer 68 is then formed overlying active region 14. In one embodiment, gate dielectric layer 68 is formed by thermally oxidizing a portion of semiconductor substrate 10 to form a thermal oxide layer that overlies active region 14. This thermal oxide layer is then annealed in an ambient comprising nitrous oxide ($NO_2$) to form a nitrided oxide layer having a thickness ranging from approximately 2 nanometers to approximately 10 nanometers. It should be appreciated that the thermal oxide layer could also be annealed in other nitriding ambients, such as ammonia ($NH_3$) or nitric oxide (NO), to form a nitrided oxide layer. Alternatively, gate dielectric layer 68 may be a layer of thermal silicon dioxide, a layer of silicon nitride, a layer of silicon oxynitride, a layer of chemically vapor deposited silicon dioxide, or a combination thereof. It is important to note that oxidation resistant layer 62 protects active region 16 and active region 18 when gate dielectric layer 68 is formed. Specifically, oxidation resistant layer 62 prevents active region 16 and active region 18 from being oxidized or nitrided when gate dielectric layer 68 is formed.

More importantly, oxidation resistant layer 62 also prevents portions of the field isolation region 12 from being etched when surface portion 66 is exposed. In addition, oxidation resistant layer 62 also prevents portions of the field isolation region 12 from being etched when surface portion 66 is subsequently cleaned with a pre-gate clean that comprises hydrofluoric acid or with other ambients that would etch field isolation region 12.

A polysilicon layer is then formed overlying active region 14, active region 16 and active region 18. It is then patterned to leave a remaining portion 70 overlying active region 14. It should also be appreciated that remaining portion 70 may also be formed with another conductive layer, such as an amorphous silicon layer, a silicon-germanium layer, or the like.

An oxidation resistant layer 72 is then formed overlying remaining portion 70, active region 16, and active region 18. In one embodiment, oxidation resistant layer 72 is an ONO dielectric layer. In this particular embodiment, a first oxide layer is formed by thermally oxidizing a portion of remaining portion 70 and then a layer of silicon nitride is chemically vapor deposited to overly this first oxide layer, active region 16, and active region 18. A surface portion of the silicon nitride layer is then re-oxidized to form a second oxide layer overlying the silicon nitride layer. Alternatively, the second oxide layer may be formed using a layer of chemical vapor deposited silicon oxide. It should be appreciated that oxidation resistant layer 72 need not be formed as a composite layer. For example, oxidation resistant layer 72 may be formed using a layer of silicon nitride or a layer of silicon oxynitride. In addition, it should be appreciated that oxidation resistant layer 62, which is overlying active region 16 and active region 18 in FIG. 11, may be removed prior to forming oxidation resistant layer 72.

Figure 12:
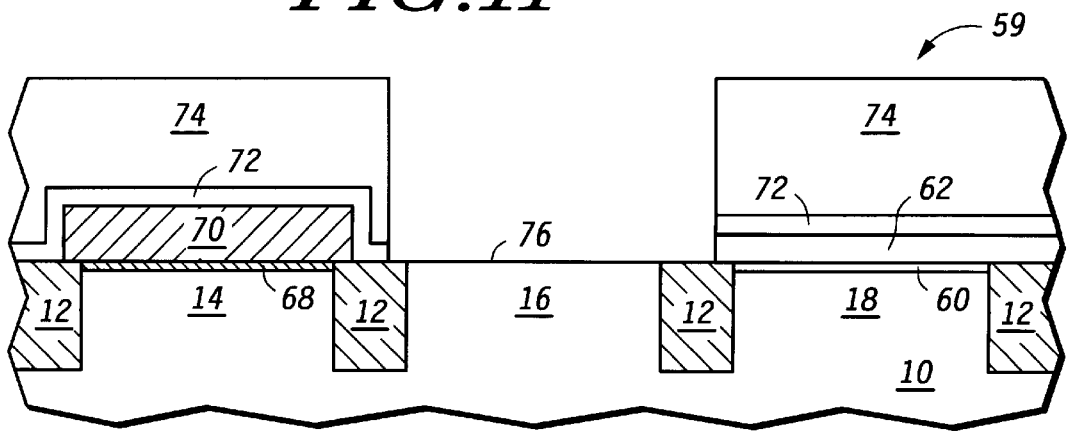

In FIG. 12, an etch mask 74 is then formed overlying active region 14, and active region 18. A portion of oxidation resistant layer 72, a portion of oxidation resistant layer 62, and a portion of pad oxide layer 60 that overly active region 16 are then removed to expose a surface portion 76 of semiconductor substrate 10. Oxidation resistant layer 72, oxidation resistant layer 62, and pad oxide layer 60 may be removed using conventional dry or wet etching techniques or a combination thereof. For example, oxidation resistant layer 72 and oxidation resistant layer 62 may be removed using a fluorinated plasma etch chemistry, and pad oxide layer 60 may be removed using hydrofluoric acid.

Figure 13:
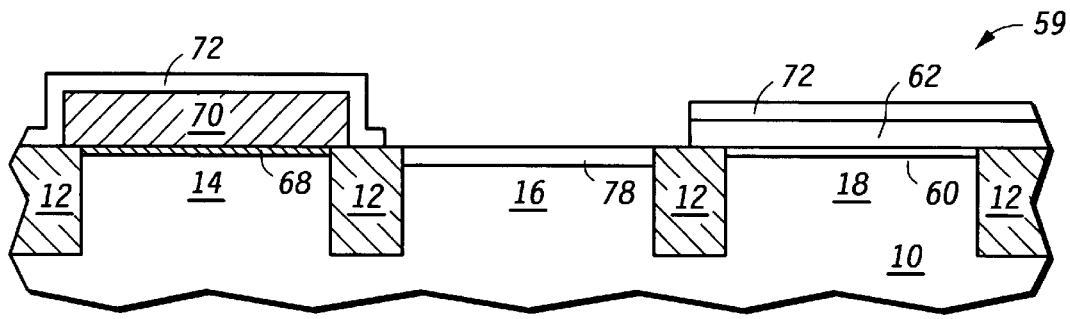

In FIG. 13, a gate dielectric layer 78 is then formed overlying active region 16. In one embodiment, gate dielectric layer 78 is a layer of thermal silicon dioxide having a thickness ranging from approximately 5 nanometers to approximately 50 nanometers, and is formed by thermally oxidizing surface portion 76 of semiconductor substrate 10. Alternatively, gate dielectric layer 78 may be a nitrided oxide layer, a silicon oxynitride layer, a layer of chemically vapor deposited silicon dioxide, or the like. It is important to note that oxidation resistant layer 62 and oxidation resistant layer 72 protect active region 14 and active region 18 when gate dielectric layer 78 is formed. Specifically, oxidation resistant layer 62 and oxidation resistant layer 72 prevent active region 18, remaining portion 22, and active region 14 from being oxidized or nitrided when gate dielectric layer 78 is formed. More importantly, oxidation resistant layer 62 and oxidation resistant layer 72 also prevent portions of the field isolation region 12 from being etched when surface portion 76 is exposed. In addition, oxidation resistant layer 62 and oxidation resistant layer 72 also prevent portions of the field isolation region 12 from being etched when surface portion 76 is subsequently cleaned with a pre-gate clean that comprises hydrofluoric acid or with other ambients that would etch field isolation region 12. Note, if oxidation resistant layer 62 is removed prior to forming oxidation resistant layer 72, as previously discussed, then oxidation resistant layer 72 would prevent active region 18, remaining portion 22, and active region 14 from being oxidized or nitrided, and would also prevent portions of field isolation region 12 from being etched.

Figure 14:
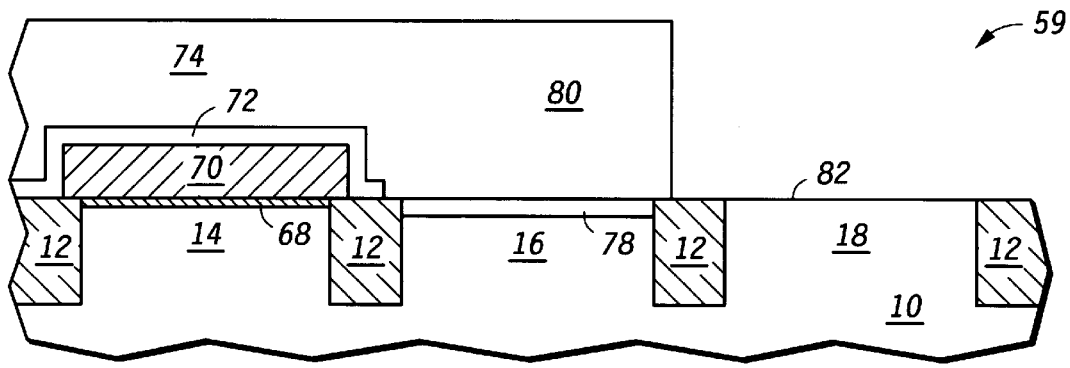

In FIG. 14, an etch mask 80 is then formed overlying active region 14 and active region 16. A portion of oxidation resistant layer 72, oxidation a portion of resistant layer 62, and a portion of pad oxide layer 60 that overlie active region 18 are then removed to expose a surface portion 82 of semiconductor substrate 10. As previously discussed, oxidation resistant layer 72, oxidation resistant layer 62, and pad oxide layer 60 may be removed using conventional dry or etching techniques or a combination thereof. Note, if oxidation resistant layer 62 is removed prior to forming oxidation resistant layer 72, as previously discussed, then a portion of oxidation resistant layer 72 and a portion of pad oxide layer 60 would be removed to expose a surface portion of semiconductor substrate 10.

Figure 15:
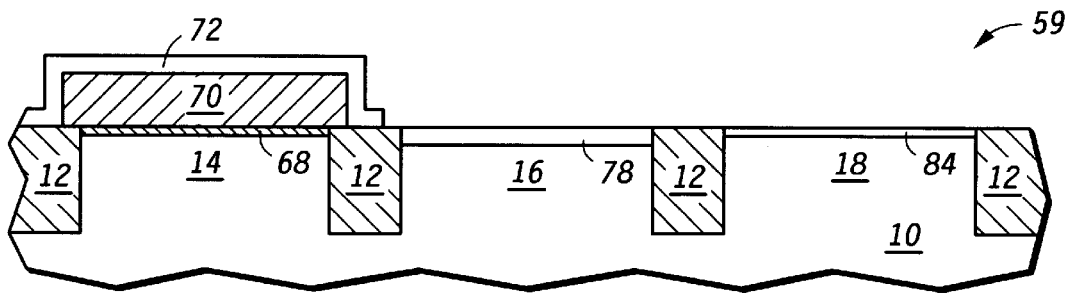

In FIG. 15, a gate dielectric layer 84 is then formed overlying active region 18. In one embodiment, gate dielectric layer 84 is a layer of thermal silicon dioxide having a thickness ranging from approximately 2 nanometers to approximately 15 nanometers, and is formed by thermally oxidizing surface portion 82 of semiconductor substrate 10. Alternatively, gate dielectric layer 84 may be a nitrided oxide layer, a silicon oxynitride layer, a silicon nitride layer, a layer of chemically vapor deposited silicon dioxide, or the like. As shown in FIG. 15, oxidation resistant layer 72 protects remaining portion 70 and active region 14 while gate dielectric layer 84 is formed. More importantly, oxidation resistant layer 72 also prevents portions of the field isolation region 12 from being etched when surface portion 82 is exposed. In addition, oxidation resistant layer 72 also prevents portions of the field isolation region 12 from being etched when surface portion 82 is subsequently cleaned with a pre-gate clean that comprises hydrofluoric acid. It should be appreciated that gate dielectric layer 78 is exposed while gate dielectric layer 84 is formed. Therefore, the thickness and/or composition of gate dielectric layer 78 may change when gate dielectric layer 84 is formed.

Figure 16:
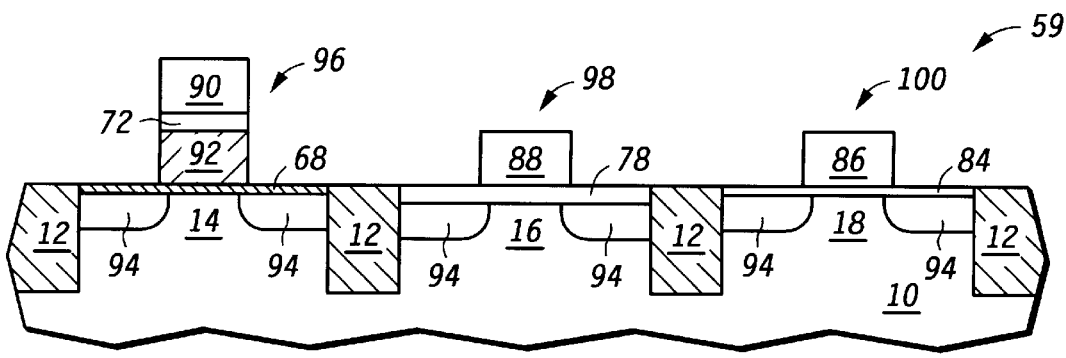

In FIG. 16, a polysilicon layer is then formed overlying remaining portion 70, active region 16, and active region 18. It is then patterned to form a gate electrode 86 overlying active region 18, a gate electrode 88 overlying active region 16, and a control gate electrode 90 overlying active region 14. In one embodiment, remaining portion 70 is also patterned to form a floating gate 92 which is self-aligned to control gate electrode 90, as shown in FIG. 16. It should be appreciated that control gate electrode 90, gate electrode 88, and gate electrode 86 may be formed with a single etch step or in separate etch steps. In addition, control gate electrode 90, gate electrode 88, and gate electrode 86 may also be formed using an amorphous silicon layer, or other conductive layer, such as a metal layer, a metal silicide layer, a metal nitride layer, or a combination thereof.

Source/drain regions 94 are then formed within active region 14, active region 16, and active region 18. As a result, a floating gate device 96 is formed within active region 14, a transistor 98 is formed within active region 16, and a transistor 100 is formed within active region 18. It is important to note that floating gate device 96, transistor 98, and transistor 100 each have a different gate dielectric layer.

This difference allows the performance of floating gate device 96, transistor 98 and transistor 100 to be individually optimized. In this particular embodiment, second gate dielectric layer 78 has a higher breakdown voltage than third gate dielectric layer 84 because second gate dielectric layer 78 is thicker than third gate dielectric layer 84. Therefore, transistor 98 can be characterized as high breakdown voltage transistor and transistor 100 can be characterized as a low breakdown voltage transistor. Thus, with the present invention an integrated circuit having devices with multiple gate dielectric layers can be fabricated, and etching of the field isolation region (12) which causes recessing or thinning of the field isolation region (12) can be minimized.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to an integrated circuit having a floating gate device, wherein the control gate electrode of the floating gate device is self-aligned to its underlying floating gate. An integrated circuit having a floating gate device, wherein the control gate electrode of the floating gate device is not self-aligned to its underlying floating gate may also be fabricated with the present invention. Therefore, it is intended that this invention encompass all such variations and modifications as fall within the scope of the appended claims.

What is claimed is:

1. A method for forming an integrated circuit comprising the steps of:
    providing a semiconductor substrate;
    forming a field isolation region within the semiconductor substrate, wherein the field isolation region defines a first active region, a second active region, and a third active region;
    forming a first gate dielectric layer overlying the first active region;
    forming a patterned conductive layer overlying the first gate dielectric layer;
    forming an oxidation resistant layer overlying the patterned conductive layer, the second active region, and the third active region;
    removing a first portion of the oxidation resistant layer overlying the second active region;
    forming a second gate dielectric layer overlying the second active region, wherein the second gate dielectric layer is formed after the first portion of the oxidation resistant layer has been removed;
    removing a second portion of the oxidation resistant layer overlying the third active region, wherein the second portion of the oxidation resistant layer is removed after at least a portion of the second gate dielectric layer has been formed;
    forming a third gate dielectric layer overlying the third active region, wherein the third gate dielectric layer is formed after the second portion of the oxidation resistant layer has been removed; and
    forming a control gate electrode for a floating gate device overlying a portion of the patterned conductive layer.

2. The method of claim 1, wherein the step of forming the oxidation resistant layer is further characterized as forming an oxidation resistant layer comprising silicon and nitrogen.

3. The method of claim 1, wherein the step of forming the oxidation resistant layer is further characterized as forming an oxidation resistant layer comprising silicon, oxygen and nitrogen.

4. The method of claim 1, wherein the step of forming the first gate dielectric layer is further characterized as forming a gate dielectric layer comprising silicon, oxygen and nitrogen.

5. The method of claim 4, wherein the step of forming the gate dielectric layer comprising silicon, oxygen and nitrogen is further characterized as forming a nitrided oxide layer.

6. The method of claim 1, wherein the step of forming the field isolation region comprises the step of oxidizing a portion of the semiconductor substrate.

7. The method of claim 1, wherein the step of forming the field isolation region is further characterized as forming a trench isolation region.

8. The method of claim 1, wherein the step of forming the second gate dielectric layer is further characterized as forming a gate dielectric layer having a first breakdown voltage, and wherein the step of forming the third gate dielectric layer is further characterized as forming a gate dielectric layer having a second breakdown voltage, the first breakdown voltage being greater than the second breakdown voltage.

9. The method of claim 1, wherein the step of forming the second gate dielectric layer is further characterized as forming a gate dielectric layer having a first thickness, and wherein the step of forming the third gate dielectric layer is further characterized as forming a gate dielectric layer having a second thickness, the first thickness being greater than the second thickness.

10. A method for forming an integrated circuit comprising the steps of:
    providing a semiconductor substrate;
    forming a field isolation region within the semiconductor substrate, wherein the field isolation region defines a first active region, a second active region, and a third active region;
    forming a first oxidation resistant layer overlying the field isolation region, the first active region, the second active region, and the third active region, wherein the field isolation region is formed prior to forming the first oxidation resistant layer;
    removing a first portion of the first oxidation resistant layer overlying the first active region;
    forming a first gate dielectric layer overlying the first active region, wherein the first gate dielectric layer is formed after the first portion of the first oxidation resistant layer has been removed;
    forming a patterned conductive layer overlying the first gate dielectric layer;
    forming a second oxidation resistant layer overlying the patterned conductive layer, the second active region, and the third active region;
    removing a first portion of the second oxidation resistant layer overlying the second active region;
    forming a second gate dielectric layer overlying the second active region, wherein the second gate dielectric layer is formed after the first portion of the second oxidation resistant layer has been removed;
    removing a second portion of the second oxidation resistant layer overlying the third active region, wherein the second portion of the second oxidation resistant layer is removed after at least a portion of the second gate dielectric layer has been formed;
    forming a third gate dielectric layer overlying the third active region, wherein the third gate dielectric layer is formed after the second portion of the second oxidation resistant layer has been removed; and forming a control gate electrode for a floating gate device overlying a portion of the patterned conductive layer.

11. The method of claim 10, further comprising the step of:

removing a second portion of the first oxidation resistant layer overlying the second active region and the third active region prior to forming the second oxidation resistant layer.

12. The method of claim 10, wherein the step of forming the second gate dielectric layer is further characterized as forming a gate dielectric layer having a first breakdown voltage, and wherein the step of forming the third gate dielectric layer is further characterized as forming a gate dielectric layer having a second breakdown voltage, the first breakdown voltage being greater than the second breakdown voltage.

13. The method of claim 10, wherein the step of forming the second gate dielectric layer is further characterized as forming a gate dielectric layer having a first thickness, and wherein the step of forming the third gate dielectric layer is further characterized as forming a gate dielectric layer having a second thickness, the first thickness being greater than the second thickness.

\* \* \* \* \*

UNITED STATES PATENT AND TRADEMARK OFFICE
CERTIFICATE OF CORRECTION

PATENT NO. : 6,133,093
DATED : October 17, 2000
INVENTOR(S) : Erwin J. Prinz et al.

It is certified that error(s) appear in the above-identified patent and that said Letters Patent are hereby corrected as shown below:

On first page (title page) of patent;
  The claims now read "13 Claims";
  Change to read - -20 Claims- -

Signed and Sealed this

Eighth Day of May, 2001

Attest:

Attesting Officer

NICHOLAS P. GODICI

*Acting Director of the United States Patent and Trademark Office*